United States Patent
Foster

(10) Patent No.: US 6,387,804 B1
(45) Date of Patent: May 14, 2002

(54) PASSIVATION OF SIDEWALL SPACERS USING OZONATED WATER

(75) Inventor: John C. Foster, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/664,714

(22) Filed: Sep. 19, 2000

(51) Int. Cl.[7] .................... H01L 21/44; H01L 21/336
(52) U.S. Cl. .................................. 438/682; 438/303
(58) Field of Search ............................ 438/303, 649, 438/655, 651, 682, 197, 199

(56) References Cited

U.S. PATENT DOCUMENTS

| | | |
|---|---|---|
| 4,749,640 A | 6/1988 | Tremont et al. |
| 5,541,131 A * | 7/1996 | Yoo et al. .......... 148/DIG. 147 |
| 5,911,837 A | 6/1999 | Matthews |
| 5,939,030 A | 8/1999 | Moxley et al. |
| 6,083,464 A | 7/2000 | Tanimura et al. |
| 6,184,115 B1 * | 2/2001 | Kou et al. ................. 438/586 |

* cited by examiner

Primary Examiner—Keith Christianson
Assistant Examiner—Brook Kebede

(57) ABSTRACT

Shorting between a transistor gate electrode and associated source/drain regions due to metal silicide formation on the sidewall spacers is prevented by passivating the sidewall spacer surfaces with a mixture of ozone and water. Embodiments of the invention include spraying the wafer with or immersing the wafer in, a saturated solution of ozone in water.

12 Claims, 3 Drawing Sheets

PASSIVATION OF SIDEWALL SPACERS USING OZONATED WATER

RELATED APPLICATIONS

This application contains subject matter similar to that disclosed in U.S. Pat. Ser. No. 09/660,396, filed on Sep. 12, 2000.

TECHNICAL FIELD

The present invention relates to the field of manufacturing semiconductor devices and, more particularly, to an improved salicide process of forming metal silicide contacts.

BACKGROUND OF THE INVENTION

An important aim of ongoing research in the semiconductor industry is the reduction in the dimensions of the devices used in integrated circuits. Planar transistors, such as metal oxide semiconductor (MOS) transistors, are particularly suited for use in high-density integrated circuits. As the size of the MOS transistors and other active devices decreases, the dimensions of the source/drain regions and gate electrodes, and the channel region of each device, decrease correspondingly.

The design of ever-smaller planar transistors with short channel lengths makes it necessary to provide very shallow source/drain junctions. Shallow junctions are necessary to avoid lateral diffusion of implanted dopants into the channel, since such a diffusion disadvantageously contributes to leakage currents and poor breakdown performance. Shallow source/drain junctions of less than 1,000 Å, e.g., less than 800 Å, are required for acceptable performance in short channel devices.

Metal silicide contacts are typically used to provide low resistance contacts to source/drain regions and gate electrodes. The metal silicide contacts are conventionally formed by depositing a conductive metal, such as titanium, cobalt, tungsten, or nickel, on the source/drain regions and gate electrodes by physical vapor deposition (PVD), e.g. sputtering or evaporation; or by a chemical vapor deposition (CVD) technique. Subsequently, heating is performed to react the metal with underlying silicon to form a metal silicide layer on the source/drain regions and gate electrodes. The metal silicide has a substantially lower sheet resistance than the silicon to which it is bonded. Desirably, the metal silicide is only formed on the underlying silicon, not on the dielectric sidewall spacers. Selective etching is then conducted to remove unreacted metal from the non-silicided areas, such as the dielectric sidewall spacers. Thus, the silicide regions are aligned only on the electrically conductive areas. This self-aligned silicide process is generally referred to as the "salicide" process.

A portion of a typical semiconductor device 10 is schematically illustrated in FIG. 1 and comprises a silicon-containing substrate 12 with shallow source/drain extensions 15A and source/drain 15B regions formed therein. Gate oxide 24 and gate electrode 28 are formed on the silicon-containing substrate 12. Sidewall spacers 18 are formed on opposing side surfaces 29 of gate electrode 28. Sidewall spacers 18 typically comprise silicon based insulators, such as silicon nitride, silicon oxide, or silicon carbide. The sidewall spacers 18 function to mask shallow source/drain extensions 15A during ion implantation to form source/drain regions 15B. The sidewall spacers 18 also mask the side surfaces 29 of the gate 28 when metal layer 16 is deposited, thereby preventing silicide from forming on the side surfaces 29.

After metal layer 16 is deposited, heating is conducted at a temperature sufficient to react the metal with underlying silicon in the gate electrode and substrate surface to form conductive metal silicide contacts 26. After the metal suicide contacts 26 are formed, the unreacted metal 16 is removed by etching, as with a wet etchant, e.g., an aqueous $H_2O_2$/$NH_4OH$ solution. The sidewall spacer 18, therefore, acts as an electrical insulator separating the silicide contact 26 on the gate electrode 28 from the metal silicide contacts 26 on the source/drain regions 15B. As shown in FIG. 2.

Difficulties are encountered in such a conventional silicidation process, particularly when employing silicon nitride sidewall spacers and nickel as the metal. Specifically it was found that nickel reacts with dangling silicon bonds in the silicon nitride sidewall spacers during heating to form nickel silicide layers on the sidewall spacer surface 20 forming an electrical bridge between the nickel silicide contact 26 on the gate electrode 28 and the nickel silicide contact 26 on the source/drain regions 15B. This undesirable effect is particularly problematic as device design rules plunge into the deep sub-micron range and is schematically illustrated in FIG. 3, wherein sidewall spacer surface 20 contains dangling silicon bonds 21. When the metal layer 16 is deposited on the sidewall spacer surface 20 and heated, a metal silicide layer 26 remains on the surface of the sidewall spacer 20 after etching.

Bridging between the gate electrode and the associated source/drain regions results in diminished device performance and device failure.

The term semiconductor devices, as used herein, is not be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need for efficient methodology to produce highly reliable semiconductor devices with ultra-shallow junctions by eliminating bridging between a transistor gate electrodes and associated source/drain regions. There exists a particular need in this art to eliminate nickel silicide formation on silicon nitride sidewall spacer surfaces in MOS transistors.

These and other needs are met by the embodiments of the present invention, which provide a method of manufacturing a semiconductor device comprising: providing an intermediate product comprising a gate electrode on a semiconductor substrate with a gate insulating layer therebetween. The gate electrode has an upper surface and opposing side surfaces with sidewall spacers formed on the opposing side surfaces. The sidewall spacers are contacted with a fluid comprising ozone and water for a period of time sufficient to passivate the sidewall spacers.

The earlier stated needs are also met by another embodiment of the instant invention which provides a method of manufacturing a semiconductor device comprising forming silicide contacts on a semiconductor device comprising: providing an intermediate product comprising a gate electrode and source/drain regions, wherein sidewall spacers are formed on side surfaces of the gate electrode. The sidewall spacers are contacted with a fluid comprising ozone and water for a period of time sufficient to passivate the sidewall spacers. A metal layer is deposited over the intermediate product and the metal layer is subsequently heated at a temperature sufficient to cause the metal to react with silicon in the gate electrode and source/drain regions to form metal silicide. Unreacted metal is subsequently removed from the sidewall spacers. The step of contacting the sidewall spacers with the fluid passivates dangling silicon bonds in the sidewall spacers prevents the formation of metal silicide thereon.

The earlier stated needs are further met by another embodiment of the instant invention that provides a semiconductor device comprising a gate electrode on a semiconductor substrate with a gate insulating layer therebetween. The gate electrode has an upper surface and opposing side surfaces with sidewall spacers on the opposing side surfaces and source and drain regions with passivated sidewall spacers formed adjacent to the gate walls. The sidewall spacers are passivated by contacting them with a fluid comprising ozone and water.

The foregoing and other features, aspects, and advantages of the present invention will become apparent in the following detailed description of the present invention when taken in conjunction with the accompanying drawings.

DETAILED DESCRIPTION OF THE INVENTION

The present invention enables the production of semiconductor devices with improved performance and reduced failure rates by preventing electrical bridging between a transistor gate electrode and associated source/drain regions. This objective is achieved by strategically passivating the sidewall spacers to prevent metal silicide formation thereon during the silicidation process.

Figure 1:
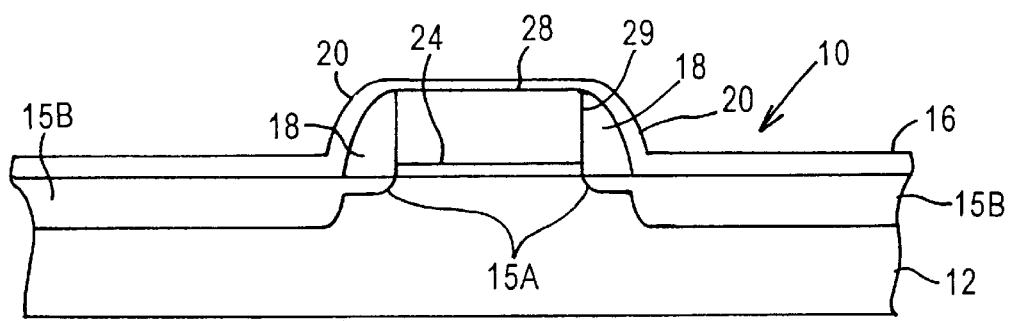
FIG. 1 schematically illustrates a gate/source/drain region of a semiconductor device formed by a conventional method.
Figure 2:
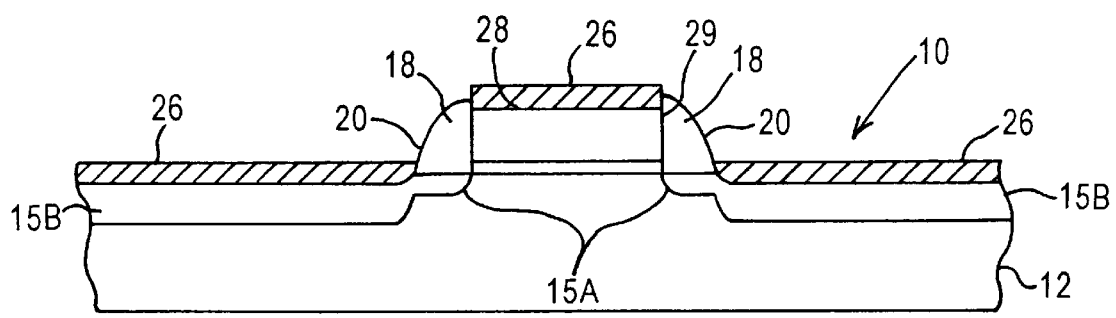
FIG. 2 schematically illustrates a gate/source/drain region of a semiconductor device formed by a conventional salicide method.
Figure 3:
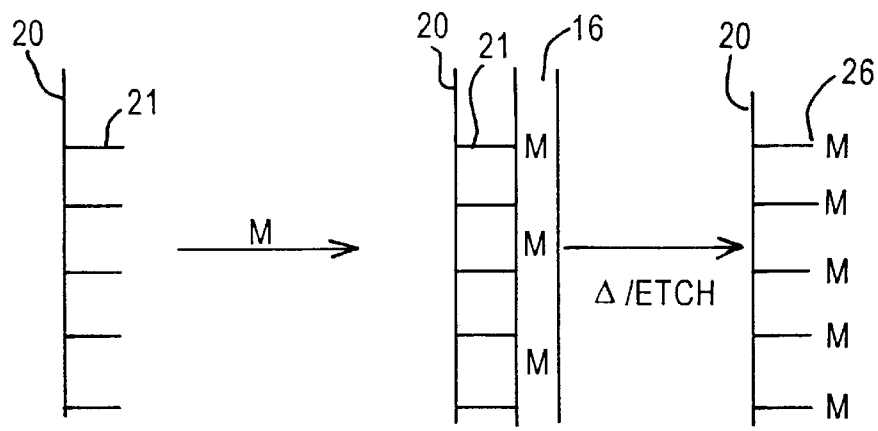
FIG. 3 schematically illustrates the formation of metal silicide on sidewall spacers.

As shown in FIG. 3, dangling silicon bonds 21 on the sidewall spacer surface 20 react with deposited metal layer 16 to form a metal silicide layer 26 on the sidewall spacer surface 20. The present invention enables the prevention of metal silicide layer 26 on sidewall spacer surface 20 by passivating the sidewall spacer surface prior to depositing metal layer 16. Such passivation substantially eliminates the dangling silicon bonds making them unavailable to react with the deposited metal.

Dangling silicon bonds can be passivated by reaction with oxygen to form an oxide that does not react with metal layer 16 during the heating process, thereby preventing conductive metal silicide from forming on the sidewall spacers. The passivated sidewall spacers then satisfy their intended function as insulators between the gate electrode and the source/drain regions.

Several techniques can be used to passivate the dangling silicon bonds with oxygen. For example, the intermediate product can be exposed to a microwave oxygen plasma. The oxygen plasma provides highly reactive oxygen ions that react with the dangling silicon bonds to form stable silicon oxides. Another technique of passivation involves contacting the semiconductor device with a solution of hydrogen peroxide and sulfuric acid. The use of oxygen plasma to passivate the spacers requires an expensive oxygen plasma generating apparatus. While the use of a hydrogen peroxide and sulfuric acid solution requires handling and subsequent disposal of highly corrosive chemicals.

The present invention provides an elegant, economical, and environmentally sound method of passivating semiconductor devices. The present invention effects sidewall spacer passivation using an ozone and water solution to provide highly reactive monatomic oxygen, which reacts with the dangling silicon bonds.

Figure 4:
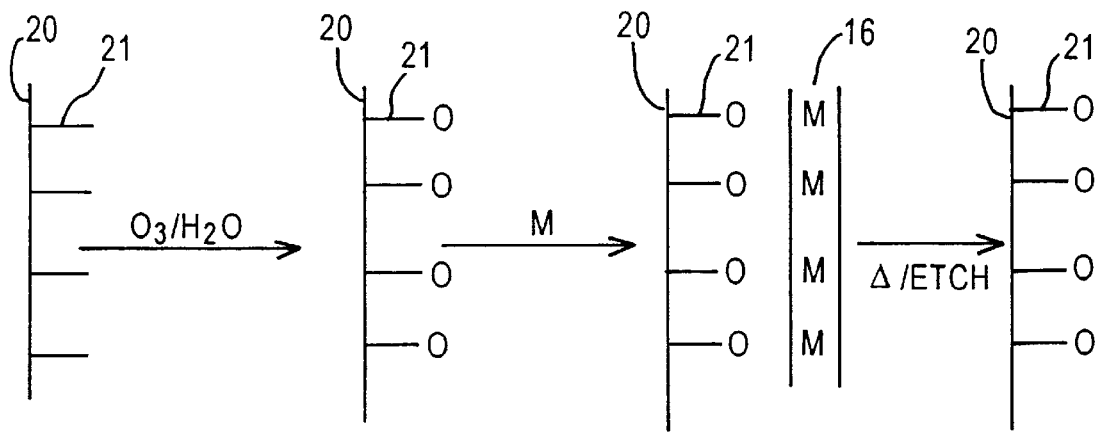
FIG. 4 schematically illustrates sidewall spacer passivation according to an embodiment of the present invention.

An embodiment of the present invention is schematically illustrated in FIG 4. A sidewall spacer surface 20 with dangling silicon bonds 21 is contacted with a solution of ozone and water for a period of time sufficient to passivate the sidewall spacer surface 20. Passivation is effected by reacting the dangling silicon bonds 21 with monatomic oxygen ions that are produced by the decomposition of ozone. The passivation step leaves the sidewall spacer surface 20 substantially free of dangling silicon bonds 21 which would otherwise react with the subsequently deposited metal, e.g., nickel, during silicidation. After passivation, metal layer 16 is deposited over the intermediate product 10, including the sidewall spacer surface 20. The metal does not react with the passivated sidewall spacer surface 20 during subsequent heating. As a result the unreacted metal is easily removed during etching, leaving sidewall spacer surface 20 substantially free of metal silicide.

A suitably saturated solution of ozone and purified water to passivate the sidewall spacer surfaces can be formed by simply mixing ozone with purified, deionized water, as by bubbling the ozone into the water. Raw water can be purified by demineralizing the water, as by passage through cation and anion filters to remove ions. The water is then degassed and subsequently filtered via submicron filtration to remove particulates. The water can be further purified by subjecting it to ultraviolet radiation or distillation.

Ozone can be provided by an ozone generator such as those described in U.S. Pat. Nos. 5,939,030 and 6,083,464. Ozone ($O_3$) is a highly reactive form of oxygen, which readily decays into diatomic oxygen ($O_2$) and monatomic oxygen ion ($O^-$). Ozone can be introduced into the purified water either immediately before treating the sidewall spacers with the ozone/water solution, or it can be added to purified water and stored for future use. If the ozone/water solution is stored, it should be stored at a temperature sufficiently low to inhibit decomposition. In additions a lower temperature solution enables dissolution of a greater amount of ozone. Suitable concentrations of ozone in water for use in embodiments of the present invention is between about 25 ppm and 300 ppm, e.g., about 100 ppm.

Figure 5:
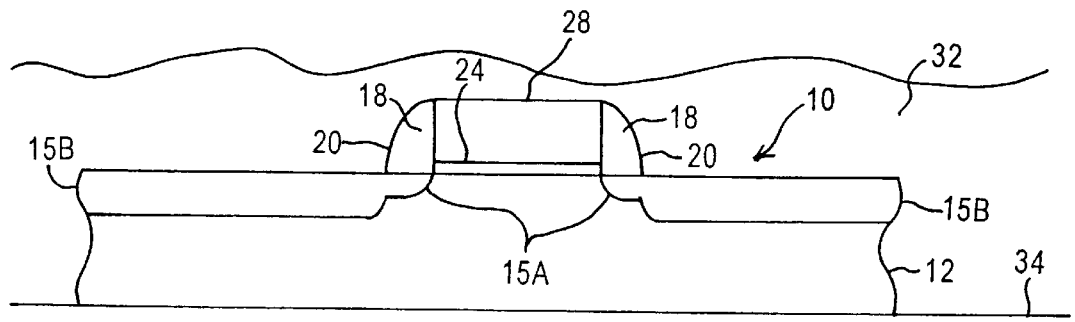
FIG. 5 illustrates the passivation of the sidewall spacers of a semiconductor device by immersing the semiconductor in an ozone/water solution.
Figure 6:
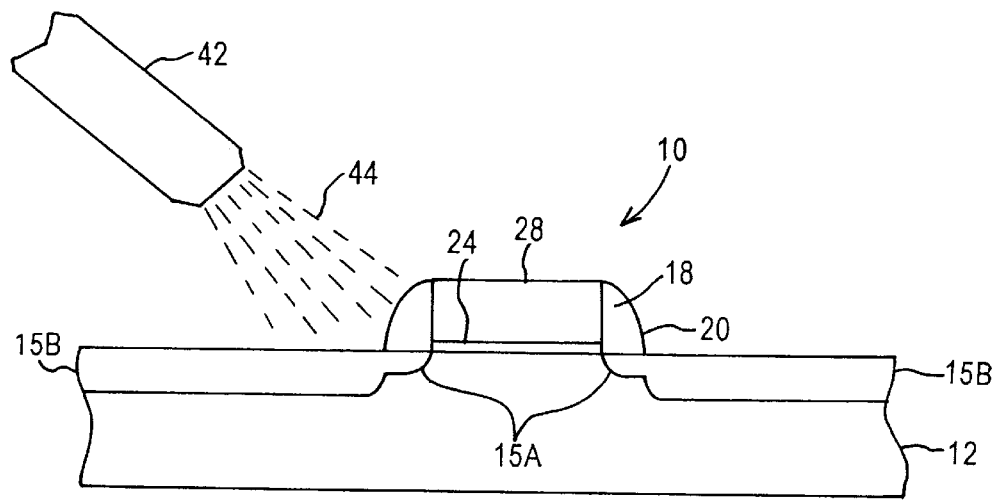
FIG. 6 illustrates the passivation of sidewall spacers of a semiconductor device by spraying the device with an ozone/water solution.

The sidewall spacers can be brought into contact with the ozone/water solution by immersing the intermediate product 10 in a vessel 34 containing the ozone/water solution 32, as illustrated in FIG. 5. Alternatively, the ozone/water solution 44 can be sprayed onto the sidewall spacers by employing a spray nozzle 42, as illustrated in FIG. 6.

Silicon bonds on the surface of the gate electrode and source/drain regions will also react with the ozone/water solution to form a thin oxide layer on their respective surfaces. However, the oxide layer formed on the surfaces of the gate electrode and source/drain regions does not prevent subsequent silicide formation thereon because these regions are predominately elemental silicon available for chemical reaction with the metal layer. The sidewall spacers, on the other hand, are predominately relatively inert silicon compounds, where only dangling silicon bonds are available for reaction with the metal layer. While a portion of the silicon on the surface of the gate electrode and source/drain regions forms a thin oxide when exposed to the ozone solution, there is abundant silicon remaining to form the metal silicide contacts.

Figure 7:
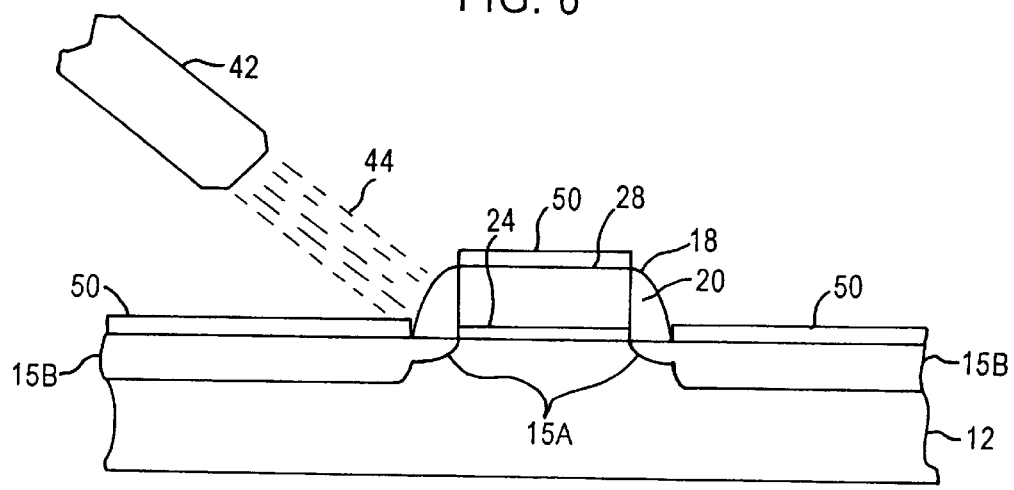
FIG. 7 illustrates the selective passivation of sidewall spacers of a semiconductor device.

In an alternative embodiment, the gate electrode 28 and source/drain regions 15B are masked, e.g. a patterned photoresist layer 50, leaving the sidewall spacers 18 selectively exposed to the ozone solution to prevent oxides from forming on the gate electrode 28 and source/drain regions 15B, as shown in FIG. 7 The mask 50 is removed prior to depositing the metal layer 16.

The temperature of the ozone/water solution employed for passivation in accordance with embodiments of the present invention can range from about 1° C. to about 80° C. Because lower temperature solutions can hold more ozone and have a lower rate of ozone decomposition, the solution is advantageously applied between about 5° C. and about 35° C. It was found that a temperature of about 17° C. to about 27° C. advantageously permits the convenience of room temperature processing with an acceptably low rate of ozone decomposition.

The ozonated water solution is brought into contact with the sidewall spacers for a period of time sufficient to effect passivation. The length of time to effect passivation can be determined for a particular situation. For example, in passivating silicon nitride sidewall spacers, an exposure time of about 1 minute to about 60 minutes, e.g., about 5 minutes to about 35 minutes, is sufficient to prevent formation of nickel silicide thereon.

The metal layer 16 comprises a metal that forms a metal silicide with high conductivity. Typical silicidation metals include Co, Ni, Ti, W, Ta, Mo, Cr, Pt, and Pd. The amount of surface oxidation of the gate and source and drain regions influences the choice of metal for the metal layer. While there is abundant silicon available for forming metal silicide bonds, the ability to form silicide bonds through the oxide surface layer varies with the metal. Metals that diffuse through the oxide layer, such as nickel, are particularly advantageous. Nickel diffuses through the oxide layer and quickly reacts with Si to form NiSi on the gate electrode and source/drain regions.

Metal layer 16 is deposited by a PVD method, such as sputtering or evaporation, or a CVD method. The metal layer is deposited to thickness of about 100 Å to about 500 Å. The metal is heated at a temperature ranging from about 300° C. to about 1000° C. depending on the metal deposited. For example, if Co is deposited the Co is heated for about 10 to 60 seconds at about 600 to 850° C. to form $CoSi_2$. When Ni is the metal deposited, the metal layer is heated for about 15 to about 120 seconds between about 350 to 700° C. to form NiSi.

The method of the present invention prevents metal silicide bridging across sidewall spacers. This invention prevents device failure due to electrical bridging between the gate electrode and the source/drain regions. By reacting dangling silicon bonds with oxygen to form insulating oxides at the surface of the sidewall spacers, deposited metal layer does not react with the dangling silicon bonds to form conductive silicides. The present invention provides sidewall spacer surfaces that are substantially free of dangling silicon bonds and metal silicide. This invention increases the yield of semiconductor fabrication processes in a novel and elegant manner.

The embodiments illustrated in the instant disclosure are for illustrative purposes only. The embodiments illustrated should not construed to limit the scope of the claims. As is clear to one of ordinary skill in the art, the instant disclosure encompasses a wide variety of embodiments not specifically illustrated herein.

What is claimed is:

1. A method of manufacturing a semiconductor device, the method comprising:

providing an intermediate product comprising: a gate electrode on a semiconductor substrate with a gate insulating layer therebetween, the gate electrode having an upper surface and opposing side surfaces; and sidewall spacers on the opposing side surfaces; and contacting the sidewall spacers with a fluid comprising ozone and water for a period of time sufficient to passivate the sidewall spacers.

2. The method according to claim 1, wherein the sidewall spacers comprise silicon nitride.

3. The method according to claim 2, wherein the fluid comprises a saturated ozone and water solution.

4. The method according to claim 2, wherein a concentration of the ozone in the water is about 25 ppm to about 300 ppm.

5. The method according to claim 2, comprising contacting the sidewall spacers at a temperature of about 1° C. to about 80° C.

6. The method according claim 2, comprising contacting the sidewall spacers by immersing the intermediate product in the fluid.

7. The method according to claim 2, comprising contacting the sidewall spacers by spraying the fluid onto the intermediate product.

8. The method according to claim 2, comprising contacting the sidewall spacers with the fluid for about 1 minute to about 60 minutes.

9. The method according to claim 2, further comprising forming source/drain regions in the substrate adjacent to the sidewall spacers.

10. The method according to claim 9, further comprising forming silicide contacts on a semiconductor device comprising;

depositing a metal layer on the upper surface of the gate electrode, sidewall spacers, and source/drain regions;

heating to react the metal with silicon in the gate and substrate to form a metal silicide layer on the gate electrode and metal silicide layers on the source/drain regions; and removing unreacted metal from the sidewall spacers, wherein the step of contacting the sidewall spacers with the fluid comprising ozone and water passivates dangling silicon bonds in the sidewall spacers, thereby preventing the formation of metal silicide thereon.

11. The method according to claim 10, wherein the metal is nickel.

12. The method according to claim 1, wherein the sidewall spacers are selectively contacted with the fluid.

* * * * *